United States Patent
Tsuchida et al.

(10) Patent No.: US 7,457,150 B2
(45) Date of Patent: Nov. 25, 2008

(54) SEMICONDUCTOR MEMORY

(75) Inventors: Kenji Tsuchida, Kawasaki (JP);
Yoshihiro Ueda, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 12 days.

(21) Appl. No.: 11/673,206

(22) Filed: Feb. 9, 2007

(65) Prior Publication Data
US 2007/0279963 A1 Dec. 6, 2007

(30) Foreign Application Priority Data
May 24, 2006 (JP) ............... 2006-144484

(51) Int. Cl.
*G11C 11/00* (2006.01)
(52) U.S. Cl. .................. 365/158; 365/63; 365/148
(58) Field of Classification Search .............. None
See application file for complete search history.

(56) References Cited

U.S. PATENT DOCUMENTS 5,695,864 A 12/1997 Slonczewski

2007/0171706 A1* 7/2007 Fuji .................. 365/163

FOREIGN PATENT DOCUMENTS

| JP | 2003-17665 | 1/2003 |
|----|------------|--------|
| JP | 2004-103657 | 4/2004 |
| JP | 2004-348934 | 12/2004 |
| JP | 2005-71500 | 3/2005 |

OTHER PUBLICATIONS

J. DeBrosse, et al., "A 16Mb MRAM Featuring Bootstrapped Write Drivers", 2004 Symposium on VLSI Circuits Digest of Technical Papers, IEEE, 2004, pp. 454-457.

* cited by examiner

*Primary Examiner*—Tan T. Nguyen
(74) *Attorney, Agent, or Firm*—Oblon, Spivak, McClelland, Maier & Neustadt, P.C.

(57) ABSTRACT

The first memory cell in even columns is composed of a first resistance change element one end of which is connected to a first bit line, and first and second FETs connected in parallel between the other end of the first resistance change element and a second bit line. The second memory cell in odd columns is composed of a second resistance change element one end of which is connected to a third bit line, and third and fourth FETs connected in parallel between the other end of the second resistance change element and a fourth bit line. A gate of the first FET is connected to the first word line. Gates of the second and third FETs are connected together to the second word line. A gate of the fourth FET is connected to the third word line.

18 Claims, 17 Drawing Sheets

SEMICONDUCTOR MEMORY

CROSS-REFERENCE TO RELATED APPLICATIONS

This application is based upon and claims the benefit of priority from prior Japanese Patent Application No. 2006-144484, filed May 24, 2006, the entire contents of which are incorporated herein by reference.

BACKGROUND OF THE INVENTION

1. Field of the Invention

The present invention relates to a semiconductor memory with a resistance change element as a memory cell.

2. Description of the Related Art

In recent years, performed energetically is a development race of a universal memory device which, despite being non-volatile memory cell, has properties of high speed, high integration, low power consumption and high reliability. Among them, a semiconductor memory with a resistance change element as a memory cell, for instance, a magnetic random access memory with a magnetoresistive element as a memory cell is one of major candidates to achieve practical application (Refer to, for instance, U.S. Pat. No. 5,695,864, Jpn. Pat. Appln. KOKAI Publication No. 2004-348934, and "16 Mb MRAM Featuring Bootstrap Write Driver" 2004 Symposium on VLSI Circuits Digest of Technical Paper, pp. 454-457).

The magnetic random access memory enables the storage of binary data by utilization of the magnetoresistive effect. At present, as the magnetoresistive effect, it is general to utilize a tunneling magnetoresistive (TMR) effect. The TMR effect is realized by a magnetic tunnel junction (MTJ) element composed of a tunnel barrier layer and two ferromagnetic layers sandwiching the tunnel barrier layer therebetween.

Then, in the case where the magnetization directions of the two ferromagnetic layers of the MTJ element are in the same direction (parallel state), tunnel probability of the tunnel barrier layer becomes maximum, while the resistance of the MTJ element becomes minimum. This state is regarded as, for instance, "1". Further, in the case where the magnetization directions of the two ferromagnetic layers of the MTJ element are in opposite directions (anti-parallel state), tunnel probability of the tunnel barrier layer becomes minimum, while the resistance of the MTJ element becomes maximum. This state is regarded as, for instance, "0".

Here, as for data writing (magnetization reversal) to the MTJ element, a magnetic field writing system utilizing the magnetic field generated by a current flowing through a write line, and a spin momentum transfer writing system utilizing a spin torque due to a flowing of spin-polarized electrons through the MTJ element are known.

The magnetic field writing system has characteristics that switching magnetic field necessary for the magnetization reversal becomes large in proportion to miniaturization of the MTJ element. For this reason, there is a problem that, in the magnetic field writing system, when conversion efficiency to a magnetic field from a current is constant, the value of the write current becomes large due to scaling down of the MTJ element.

On the contrary, in the spin momentum transfer writing system, magnetization reversal is performed utilizing the spin torque due to the spin-polarized electrons. Then, the magnetization reversal is generated when current density of the spin injection current flowing through the MTJ element exceeds a constant value. That is, the spin momentum transfer writing system, provided that the current density is constant, has characteristics that the value of the spin injection current becomes small in proportion to the square of the length reduction ratio of the MTJ element.

Therefore, the spin momentum transfer writing system has becomes one of the major techniques for achieving practical application of the magnetic random access memory.

However, the biggest problem of the spin momentum transfer writing system is decrease of current density of the spin injection current necessary for the magnetization reversal.

For instance, in a so-called 1Tr-1MTJ type in which one memory cell is composed of one MOSFET and one MTJ element, there is a problem that sufficient current density is not obtained in the course of advance of miniaturization of the memory cell.

As one of the techniques for solving the problem, there is a technique so-called 2Tr-1MTJ, in which one memory cell is composed of two MOSFETs and one MTJ element. However, in this case, one transistor increases per memory cell, and naturally, cell size becomes large corresponding thereto, which is a disadvantage for high integration.

BRIEF SUMMARY OF THE INVENTION

A semiconductor memory according to an aspect of the present invention is provided with a first memory cell arranged in even columns and a second memory cell arranged in odd columns, wherein the first memory cell is composed of a first resistance change element one end of which is connected to a first bit line, and first and second FETs connected in parallel between the other end of the first resistance change element and a second bit line, the second memory cell is composed of a second resistance change element one end of which is connected to a third bit line, and third and fourth FETs connected in parallel between the other end of the second resistance change element and a fourth bit line, a gate of the first FET is connected to the first word line, gates of the second and third FETs are connected together to the second word line, and a gate of the fourth FET is connected to the third word line.

DETAILED DESCRIPTION OF THE INVENTION

A semiconductor memory of an aspect of the present invention will be described below in detail with reference to the accompanying drawings.

1. OUTLINE

As one of the methods for constituting a memory cell array, a double gate structure is known in which one memory cell is composed of two MOSFETs (double gate) and one resistance change element. The double gate structure is an effective technique for the semiconductor memory, for instance, for a spin transfer torque magnetic random access memory in which it causes a current to flow through the resistance change element to change its state (resistance).

An example of the present invention, in a memory cell array with such double gate structure, realizes a layout to further reduce size per memory cell. Specifically, for instance, as shown in FIGS. 1 and 2, layout of the memory cell is performed every time a column of a memory cell changes while shifting the memory cell in column direction by only half of a pitch P of its column direction.

In this case, since a resistance change element X, and bit line contact sections to lower bit line BLd or upper bit line BLu are arranged in hound's tooth layout on a memory cell array respectively, it is possible to reduce size in row direction compared with a conventional case. That is, although the conventional size per memory cell was $12F^2=4F$ (column direction)×3F (row direction), according to the layout of the present invention, it is possible to realize a size per memory cell of $8F^2=4F$ (column direction)×2F (row direction).

In this case, F represents feature size, which is a value corresponding to minimum design size.

Figure 1:
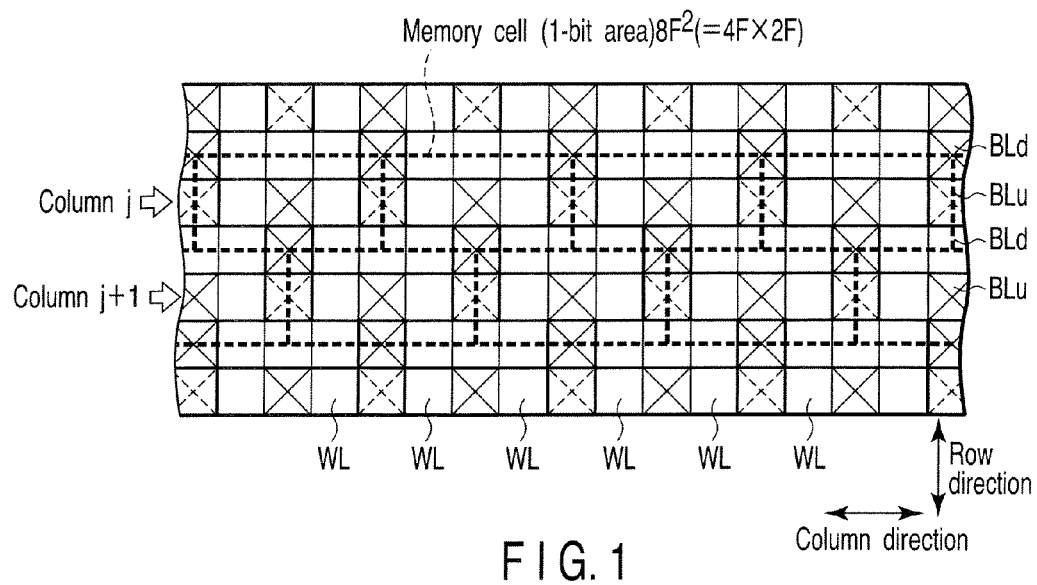
FIG. 1 is a plan view showing an outline of an example of the present invention.
Figure 2:
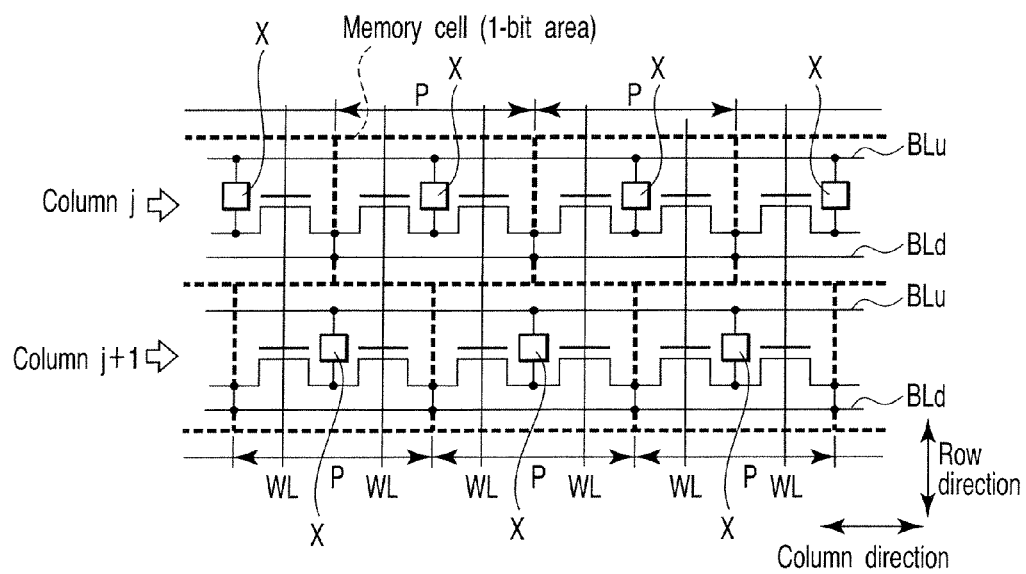
FIG. 2 is a circuit diagram showing an outline of an example of the present invention.

Further, in the memory cell of the double gate structure, when adopting the layout shown in FIGS. 1 and 2, in both cases where the memory cell of even columns j(=0, 2, 4, . . . ) is accessed and the memory cell of odd columns j+1(=1, 3, 5, . . . ) is accessed, a word line WL should be activated without fail.

Accordingly, in the example of the present invention, an address mapping due to the Gray code is adopted. According to the address mapping due to the Gray code, it is possible to activate accurately the word line WL connected to two MOSFETs at both sides of the selected resistance change element, and to achieve simplification of the layout of a row decoder and reduction of chip size by constituting the row decoder with a simple circuit.

2. COMPARATIVE EXAMPLE

There will be described a comparative example as being the premised example of the present invention.

Figure 3:
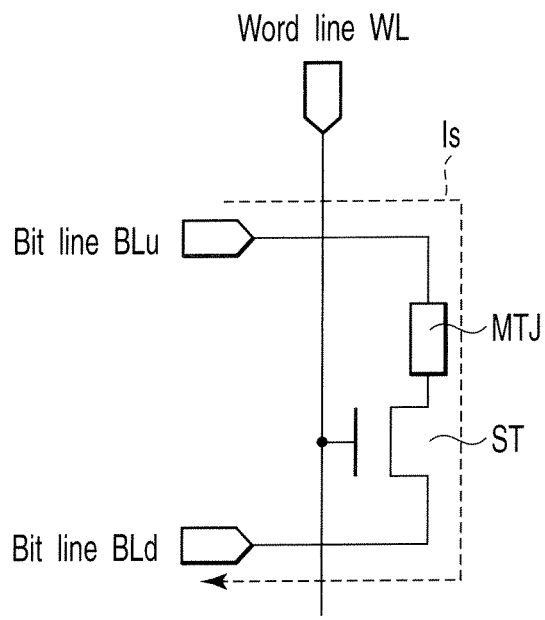
FIG. 3 is a view showing a memory cell of a magnetic random access memory.
Figure 4:
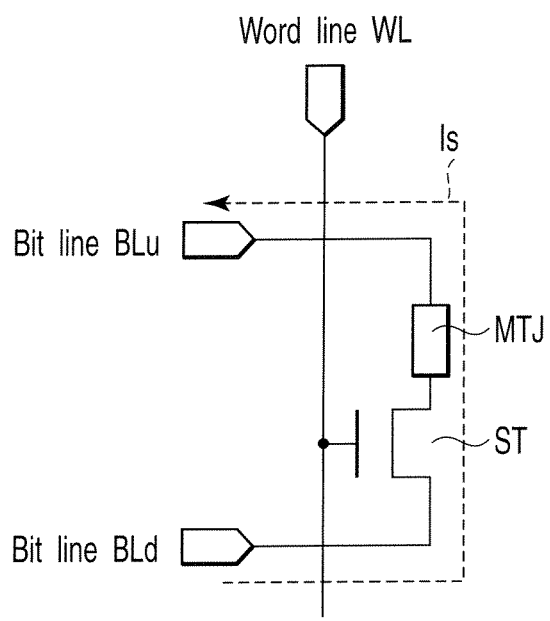
FIG. 4 is a view showing a memory cell of a magnetic random access memory.

As shown in FIGS. 3 and 4, a memory cell of the spin transfer torque magnetic random access memory is generally composed of series-connected one selection transistor ST and one MTJ element. Then, for instance, when performing "0"-writing, as shown in FIG. 3, it causes spin injection current Is to flow to the bit line BLd from the bit line BLu, while when performing "1"-writing, as shown in FIG. 4, it causes the spin injection current Is to flow to the bit line BLu from the bit line BLd.

Here, a current density of the spin injection current Is is determined by a current drivability of the selection transistor ST constituting the memory cell. Accordingly, it is necessary for the selection transistor ST to have the ability to cause the spin injection current Is to flow with a sufficient magnitude to reverse magnetization of the MTJ element. Namely, the current drivability of the selection transistor ST depends on gate width of the selection transistor ST. Thus, in the case where the current drivability is attempted to increase, it is preferable to enlarge the gate width (size of transistor).

However, in the course of advance of realization of high integration and large capacity of the memory cell, increase of size of such selection transistor ST is not preferable.

Accordingly, one technique has been proposed. This is a memory cell array constitution method called double gate structure, in which one memory cell is composed of two selection transistors and one MTJ element.

Characteristics of the double gate structure are that it is possible to realize substantial increase of gate width (current drivability) by connecting two selection transistors in parallel, and further, it is possible to minimize size per memory cell by sharing a bit line contact (a contact plug) between two memory cells arranged in a column direction.

Figure 5:
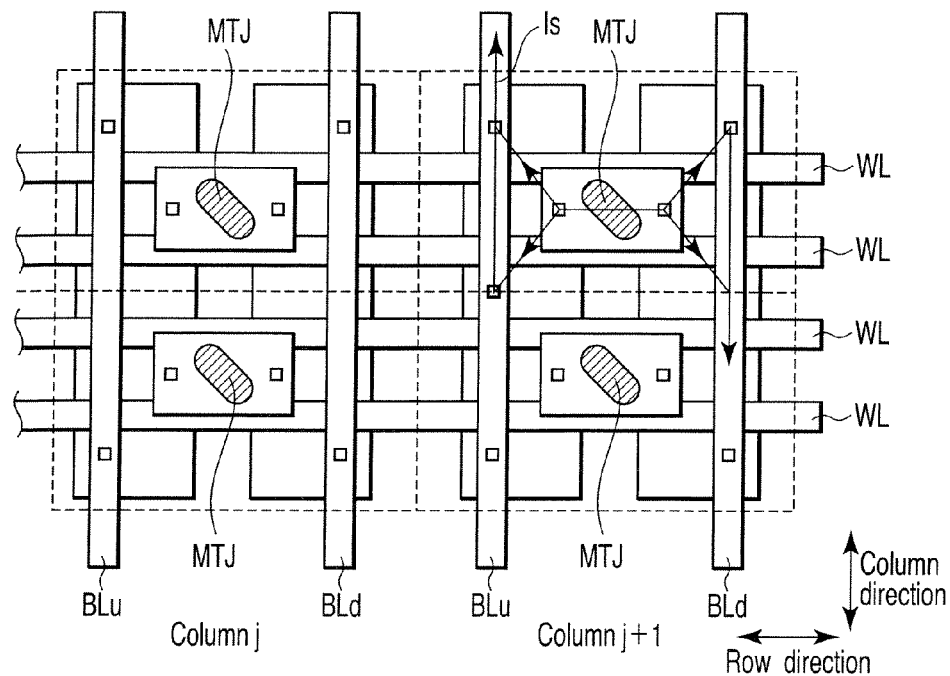
FIG. 5 is a plan view showing a layout of a memory cell with a double gate structure.

FIG. 5 shows a layout of a memory cell of the double gate structure.

In this layout, two bit lines BLu, BLd exist in one column j to change direction of the current Is flowing through the MTJ element.

Here, cell size of the memory cell of the double gate structure will be discussed.

Figure 6:
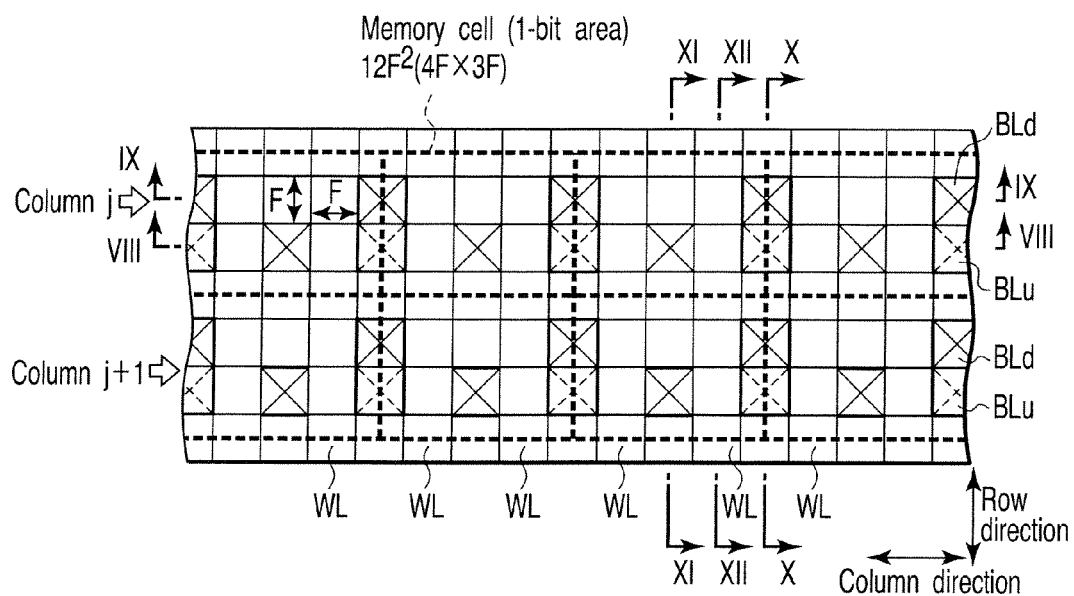
FIG. 6 is a plan view showing a layout as a comparative example.
Figure 7:
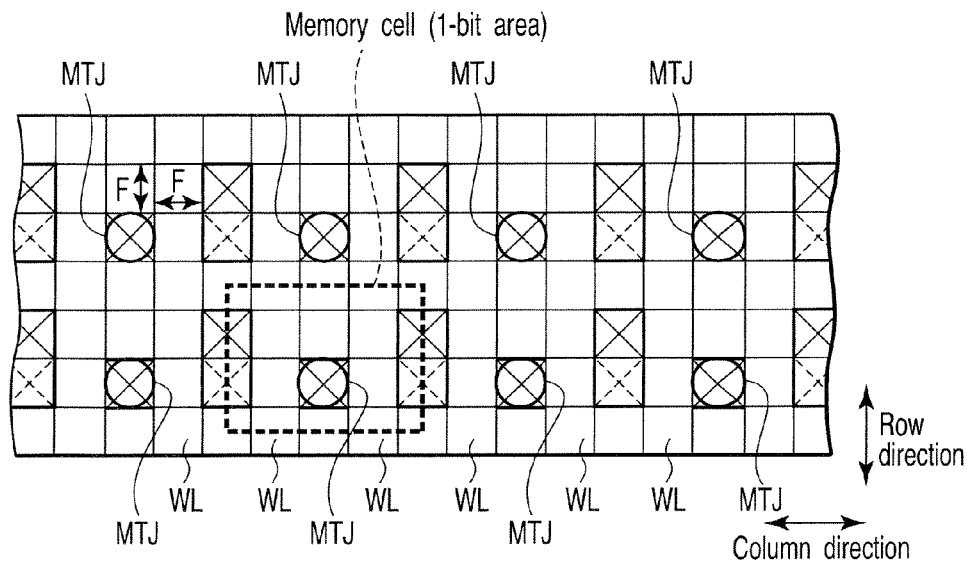
FIG. 7 is a plan view showing a layout as a comparative example.

When describing specifically the layout of the memory cell of the double gate structure in terms of the cell size, it is shown in FIGS. 6 and 7. FIG. 7 is a layout in which the bit lines BLu, BLd are eliminated from FIG. 6.

Figure 8:
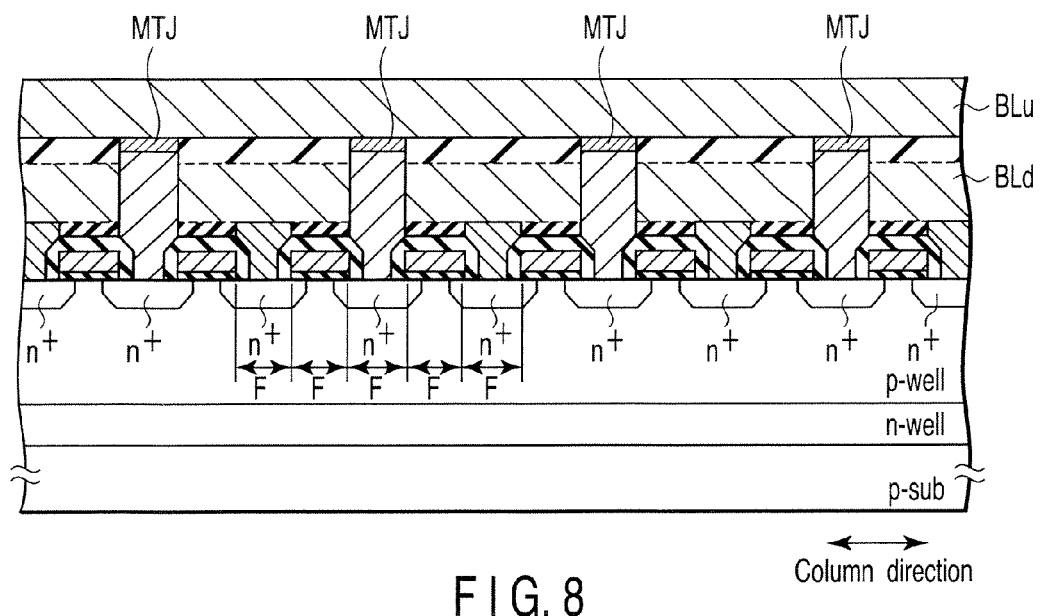
FIG. 8 is a cross-sectional view taken along the line VIII-VIII of FIG. 6.
Figure 9:
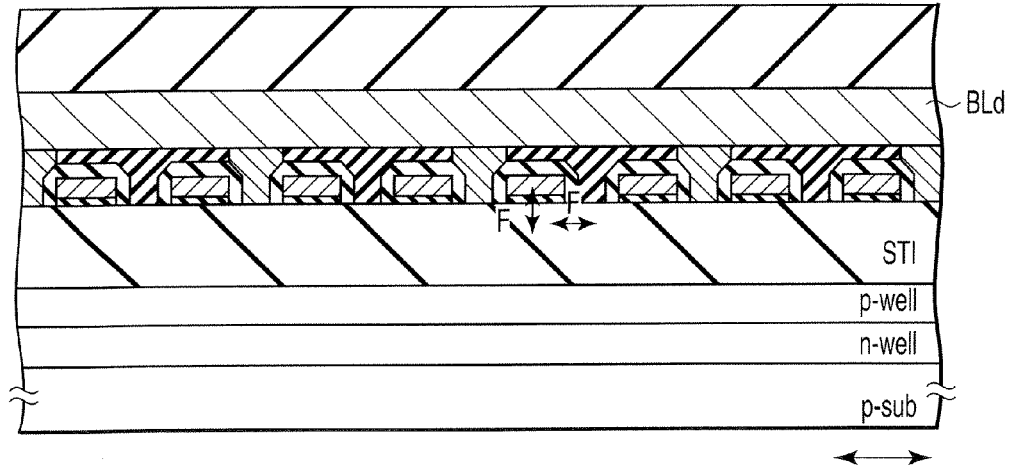
FIG. 9 is a cross-sectional view taken along the line IX-IX of FIG. 6.
Figure 10:
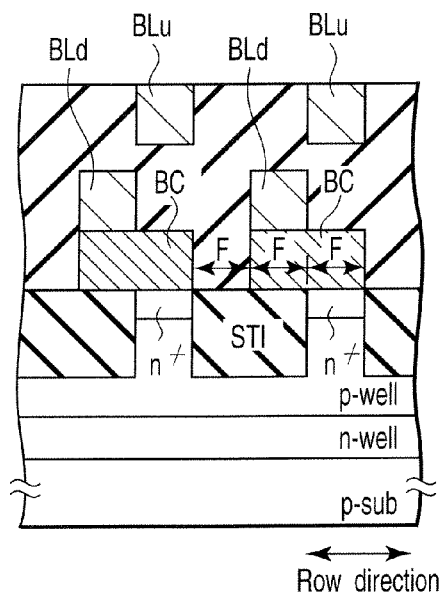
FIG. 10 is a cross-sectional view taken along the line X-X of FIG. 6.
Figure 11:
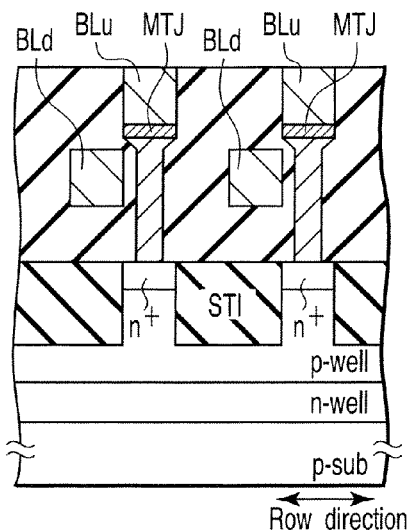
FIG. 11 is a cross-sectional view taken along the line XI-XI of FIG. 6.
Figure 12:
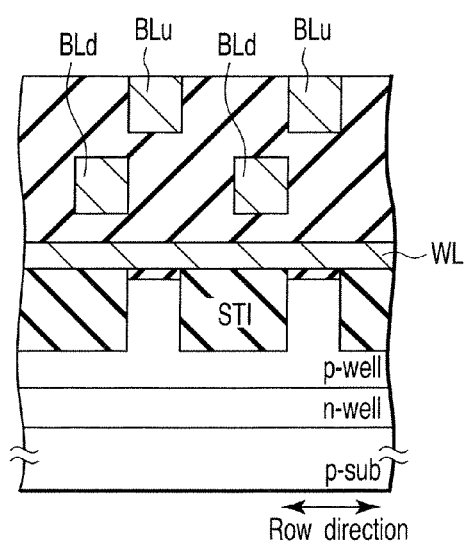
FIG. 12 is a cross-sectional view taken along the line XII-XII of FIG. 6.
Figure 13:
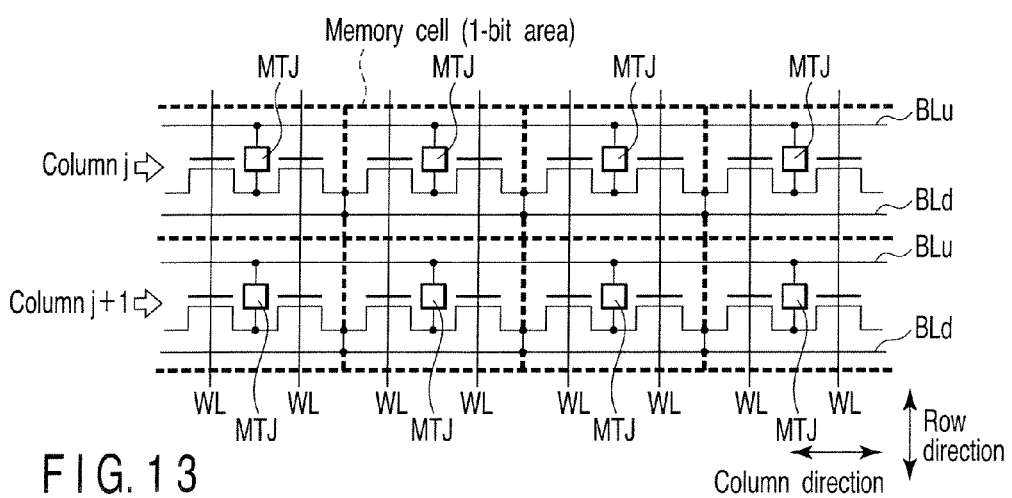
FIG. 13 is a circuit diagram showing an equivalent circuit of a layout as a comparative example.

Further, FIG. 8 is a cross-sectional view taken along the line VIII-VIII of FIG. 6, FIG. 9 is a cross-sectional view taken along the line IX-IX of FIG. 6, FIG. 10 is a cross-sectional view taken along the line X-X of FIG. 6, FIG. 11 is a cross-sectional view taken along the line XI-XI of FIG. 6, FIG. 12 is a cross-sectional view taken along the line XII-XII of FIG. 6, and FIG. 13 is an equivalent circuit of devices of FIGS. 6 to 12.

In FIGS. 6 and 7, a size of a cell is F×F. The cell size (1-bit area), since column direction is 4F and row direction is 3F, is $12F^2$.

Concerning the column direction, as shown in FIG. 8, since one transistor corresponds to 3F, accordingly two transistors should correspond to 6F, however, in this case of the layout, as one bit area, 4F can be realized by sharing the bit line contact (the contact plug).

Concerning the row direction, as shown in FIG. 10, though one transistor corresponds to F, F is necessary to secure a space between the bit line contacts BC adjacent to the row direction. Thus, the size of an element isolation region (STI) becomes 2F, and as a result, the 1-bit area becomes 3F.

Thus, even the layout which has been attempted to achieve both improvement of current drivability of the selection transistor and reduction of cell size, until now, minimum size per memory cell has been $12F^2$.

This value, for instance, when compared with $8F^2$ which is the cell size of current DRAMs, is 1.5 times thereof. Therefore, it is very difficult to make the cost per bit of semiconductor memory, with the resistance change element as a memory cell represented by the spin transfer torque magnetic random access memory, equal to the current DRAM cost.

3. Embodiments

Some embodiments which are conceivable as the most preferable will be described.

Hereinafter, there will be described the magnetic random access memory being a representative example of the semiconductor memory with a resistance change element as a memory cell.

(1) First Embodiment

Figure 14:
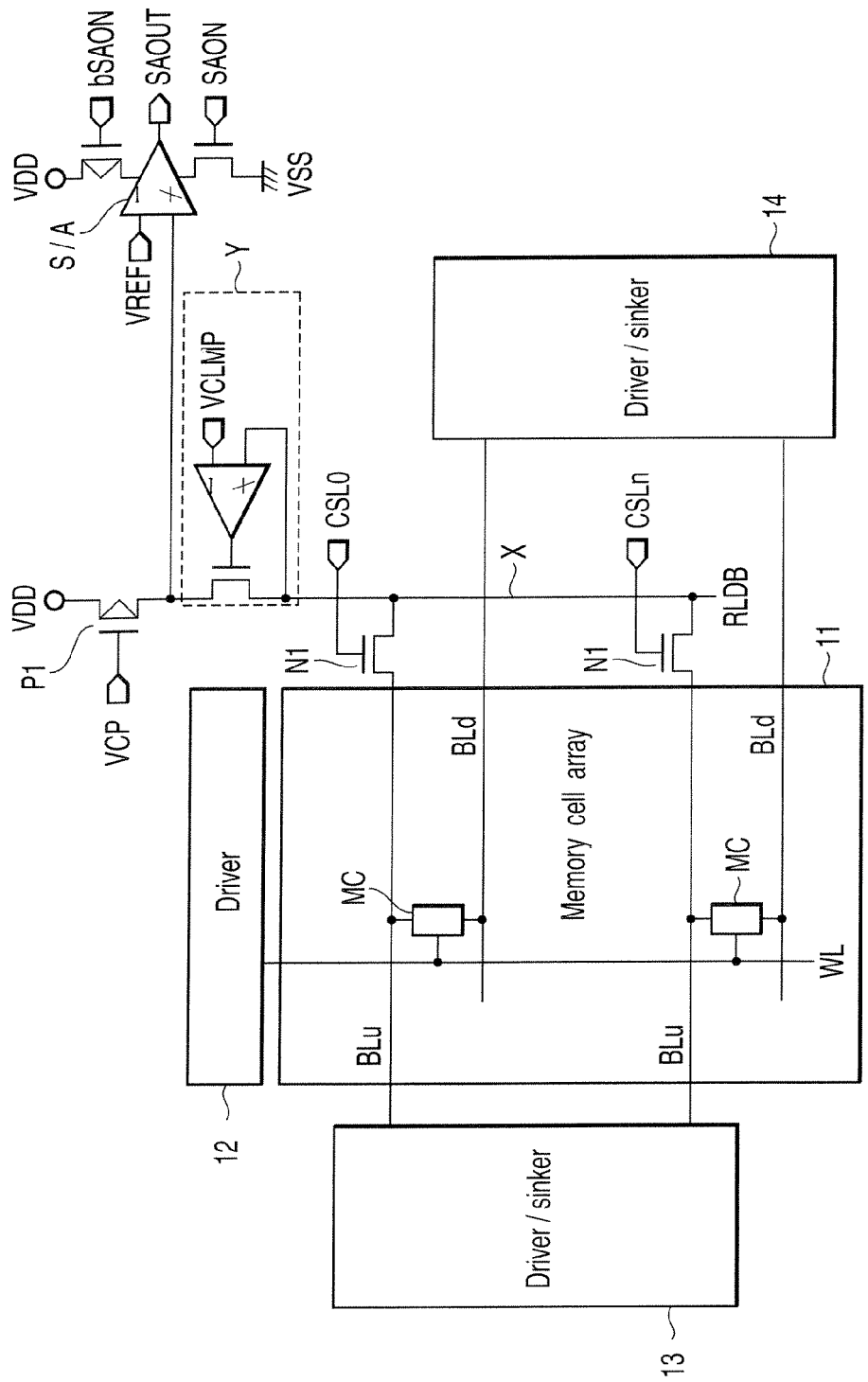
FIG. 14 is a view showing main part of the magnetic random access memory.

FIG. 14 shows a principal part of the magnetic random access memory.

A memory cell array 11 is composed of a plurality of memory cells MC. A word line WL is connected to a driver 12 and is connected to the memory cell MC in one row. A bit line BLu is connected to a driver/sinker 13 and is connected to one end of the memory cell in one column. A bit line BLd is connected to a driver/sinker 14 and is connected to the other end of the memory cell MC in one column.

The bit line BLu is further connected to a common node X via an N-channel MOS transistor (switching element) N1 for selecting a column.

The common node X is connected to a sense amplifier S/A via a clamp circuit Y. To a gate of the MOS transistor N1, column selection signals CSL0, ... CSLn are input. A P-channel MOS transistor P1 as a current/voltage conversion element generates a current when an input voltage VCP becomes lower than its source potential (VDD) by one threshold voltage or more.

The clamp circuit Y is a circuit for forcing a voltage of the bit line BLu to be maintained at a predetermined value (for instance, 0.1 to 0.6 V). Since MR ratio of the MTJ element in the memory cell MC deteriorates in proportion to reduction of a voltage applied to its both ends, the clamp circuit Y is provided to prevent this deterioration and to secure a sufficient read margin.

Figure 15:
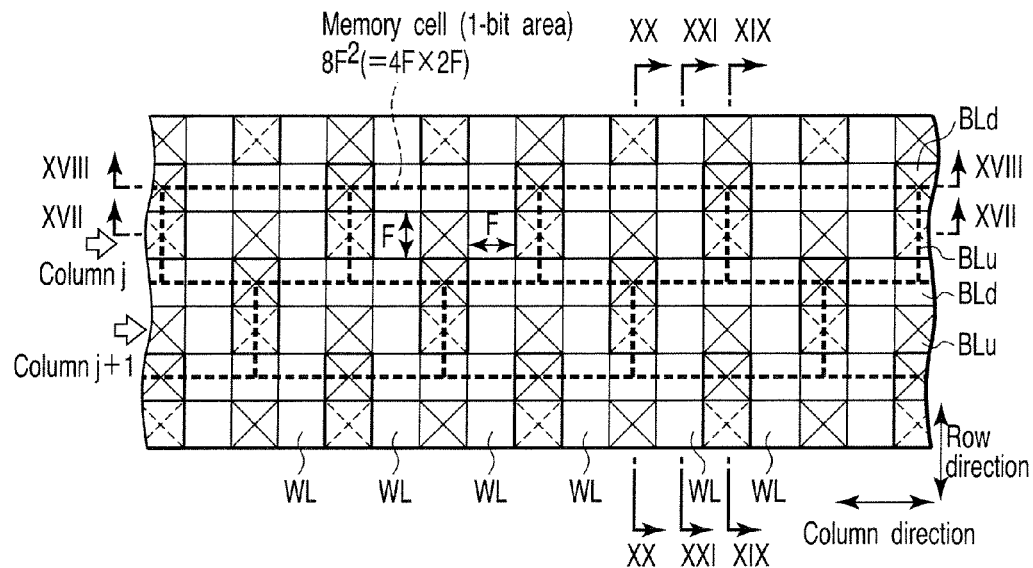
FIG. 15 is a plan view showing a layout of a first embodiment.
Figure 16:
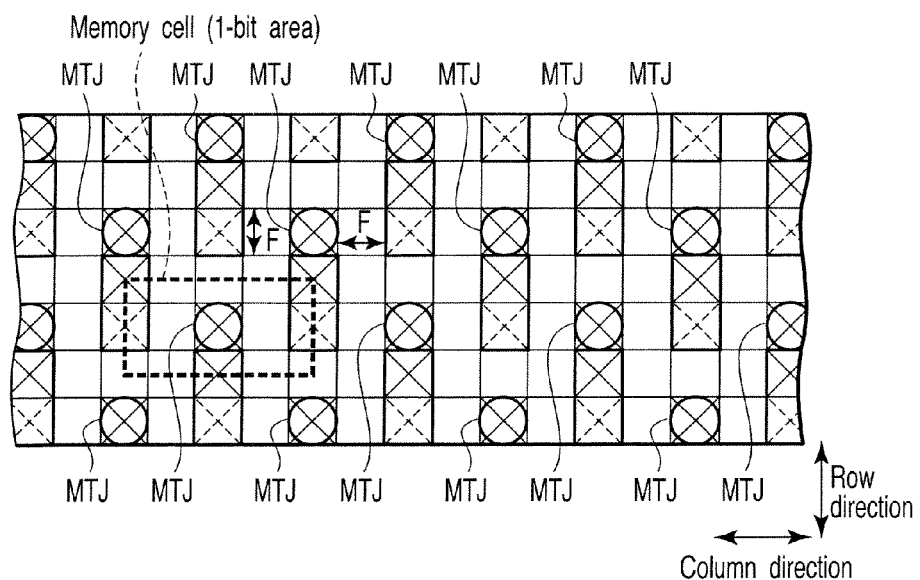
FIG. 16 is a plan view showing the layout of the first embodiment.

FIG. 15 shows the layout of the memory cell of FIG. 14. FIG. 16 is the layout in which the bit lines BLu, BLd are eliminated from FIG. 15. FIGS. 15 and 16 correspond to the layouts of FIGS. 6 and 7 being comparative examples.

Figure 17:
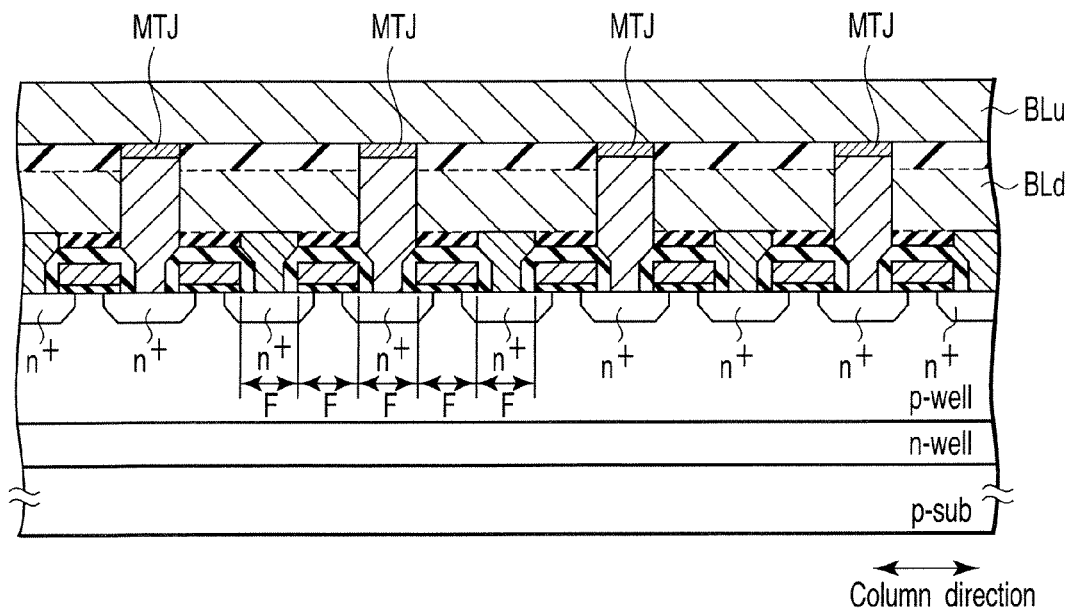
FIG. 17 is a cross-sectional view taken along the line XVII-XVII of FIG. 15.
Figure 18:
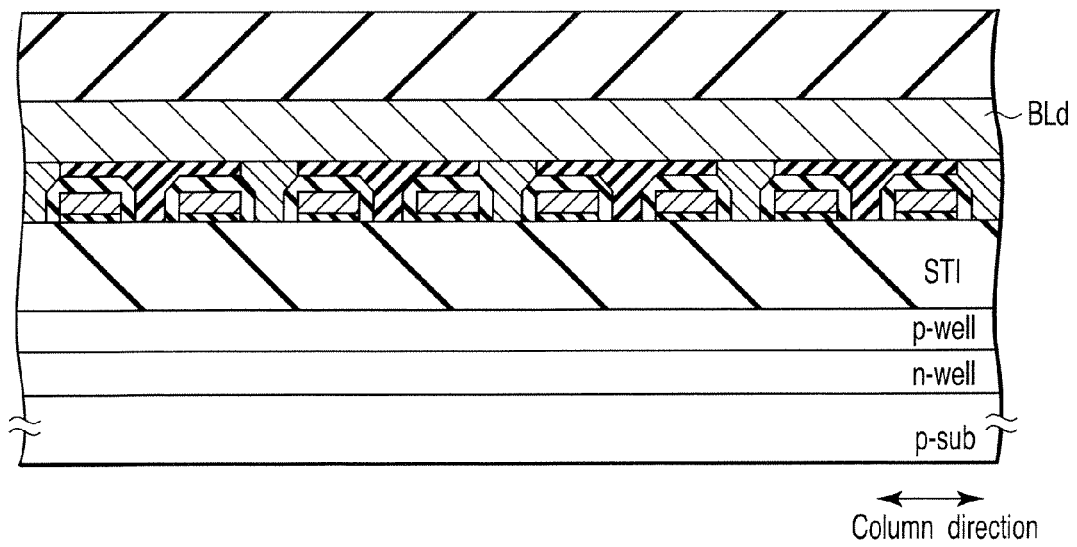
FIG. 18 is a cross-sectional view taken along the line XVIII-XVIII of FIG. 15.
Figure 19:
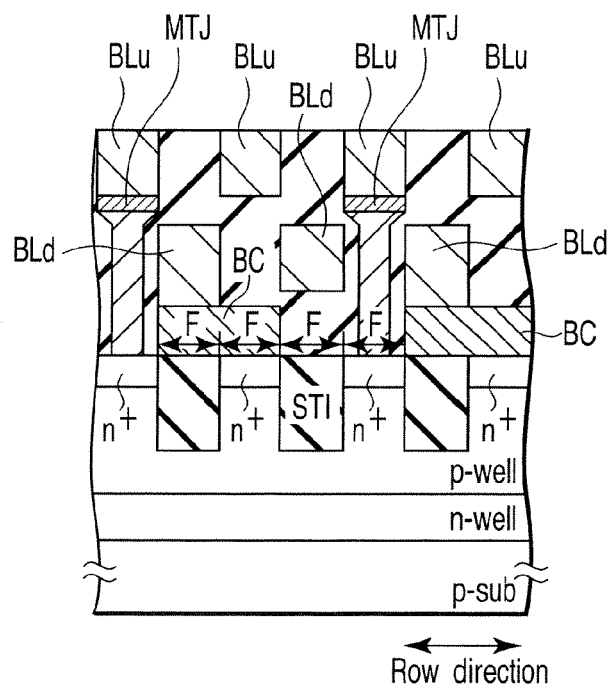
FIG. 19 is a cross-sectional view taken along the line XIX-XIX of FIG. 15.
Figure 20:
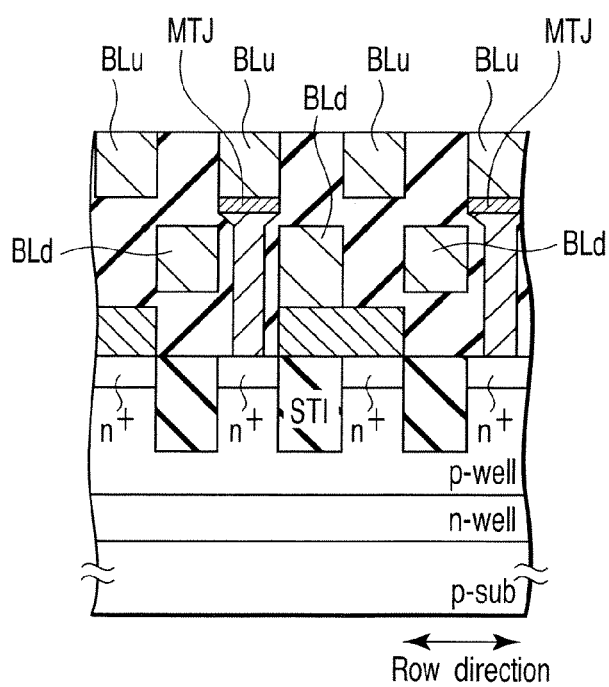
FIG. 20 is a cross-sectional view taken along the line XX-XX of FIG. 15.
Figure 21:
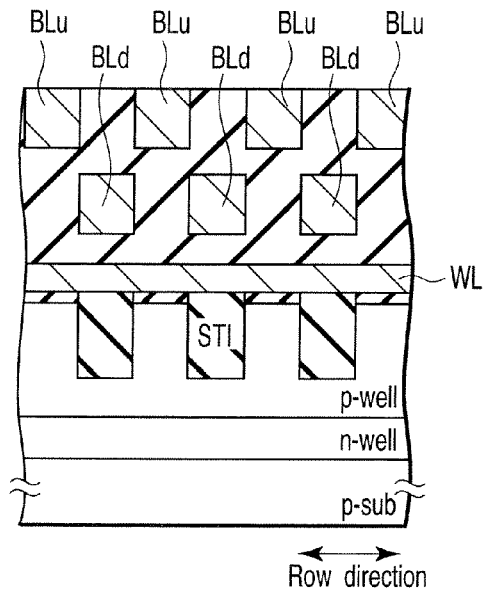
FIG. 21 is a cross-sectional view taken along the line XXI-XXI of FIG. 15.

Further, FIG. 17 is a cross-sectional view taken along the line XVII-XVII of FIG. 15, FIG. 18 is a cross-sectional view taken along the line XVIII-XVIII of FIG. 15, FIG. 19 is a cross-sectional view taken along the line XIX-XIX of FIG. 15, FIG. 20 is a cross-sectional view taken along the line XX-XX of FIG. 15, and FIG. 21 is a cross-sectional view taken along the line XXI-XXI of FIG. 15.

In FIGS. 15 and 16, a size of a cell is F×F. Further, an equivalent circuit of the device of FIGS. 15 to 21 becomes the one shown in FIG. 2.

The memory cell has the double gate structure. Further, two bit lines BLu, BLd exist in one column j to change direction of the spin injection current Is flowing through the MTJ element.

The memory cell shifts in column direction by only half of a pitch P in its column direction every time a column of a memory cell array changes.

As a result,

MTJ elements are arranged at half of the whole number of the crossing points between the word line WL and the bit line BLu.

Contact sections to the MTJ element and the bit lines BLu, BLd have the layout of hound's tooth layout respectively as a whole.

Two word lines WL existing on both sides of the memory cell are always different between the even column and the odd column.

Due to this, concerning the cell size (1-bit area), column direction becomes 4F, while row direction becomes 2F, thus it is possible to realize $8F^2$.

As shown in FIG. 17, a size of one transistor in the column direction corresponds to 3F, a size of two transistors in the column direction corresponds to 6F. However, like the comparative example, as one bit area, 4F is realized by sharing the bit line contact (the contact plug).

Concerning the row direction, as shown in FIGS. 19 and 20, since one transistor corresponds to F, and size of the element isolation region (STI) is F, so that one bit area results in 2F.

Difference from the comparative example is that F for securing a space between the bit line contacts BC adjacent to the row direction is not necessary.

That is, since the bit line contacts BC to the bit line BLd are arranged in the hound's tooth layout, in two columns j, j+1 adjacent to each other, the bit line contacts BC are not opposite to each other. For this reason, even though size of the row direction of one bit area is made 2F, it is possible to secure sufficiently a space between the bit line contacts BC.

Thus, according to the first embodiment, even in the case where the double gate structure is adopted for improvement of the current drivability (write margin) of the selection transistor, it is possible to make the size per memory cell $8F^2$.

This value is the same value as cell size of the DRAM. Therefore, it is possible to make a cost per bit of the spin transfer torque magnetic random access memory equal to that of the DRAM, and thus it becomes possible to realize a new nonvolatile memory with large capacity.

(2) Second Embodiment

Figure 22:
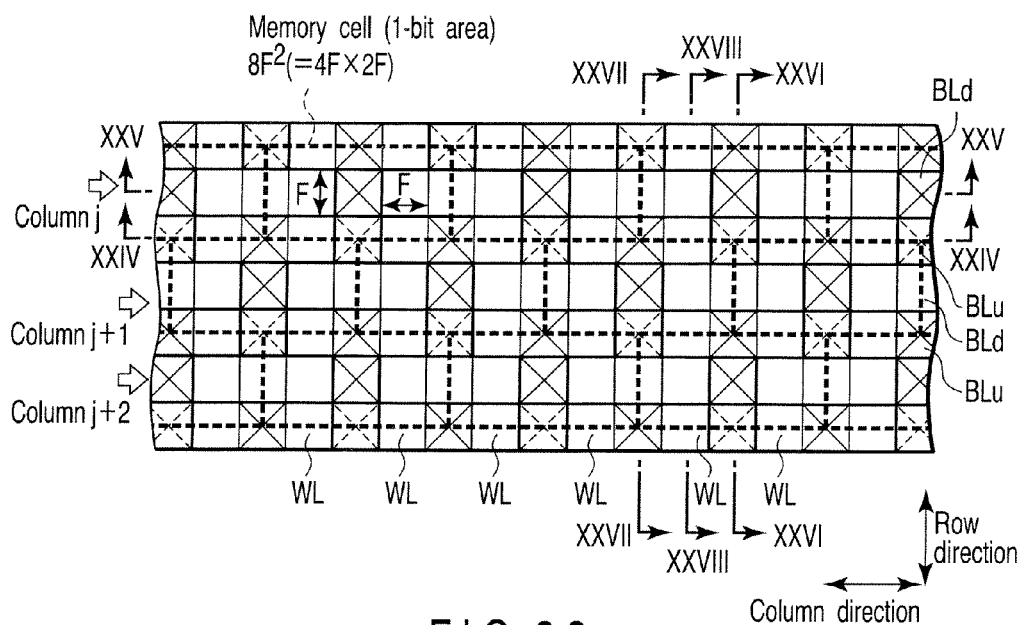
FIG. 22 is a plan view showing a layout of a second embodiment.
Figure 23:
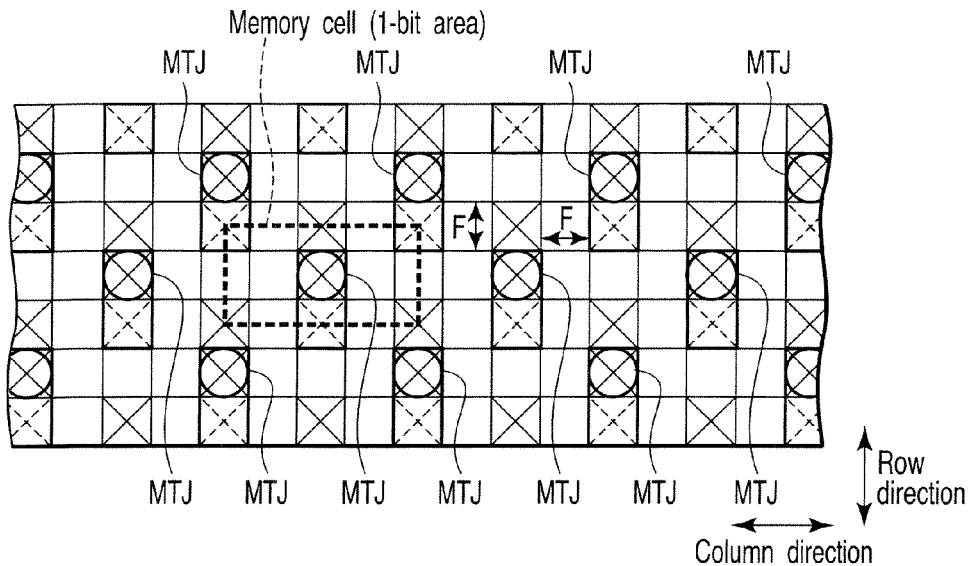
FIG. 23 is a plan view showing the layout of the second embodiment.

FIG. 22 shows a layout of a second embodiment. FIG. 23 is a layout in which the bit lines BLu, BLd are eliminated from FIG. 22. FIGS. 22 and 23 correspond to the layouts of FIGS. 6 and 7 being the comparative example.

Figure 24:
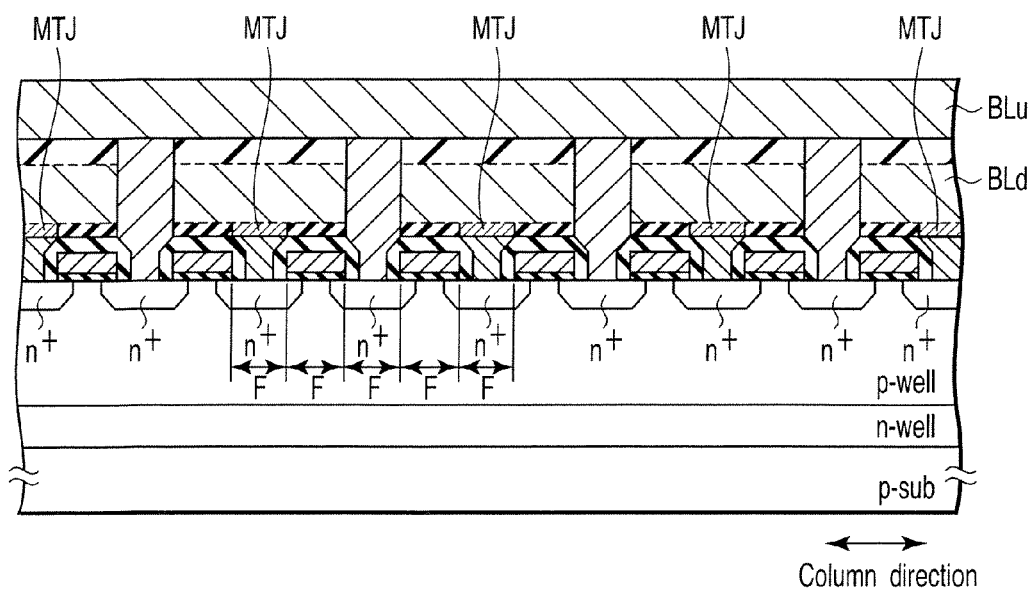
FIG. 24 is a cross-sectional view taken along the line XXIV-XXIV of FIG. 22.
Figure 25:
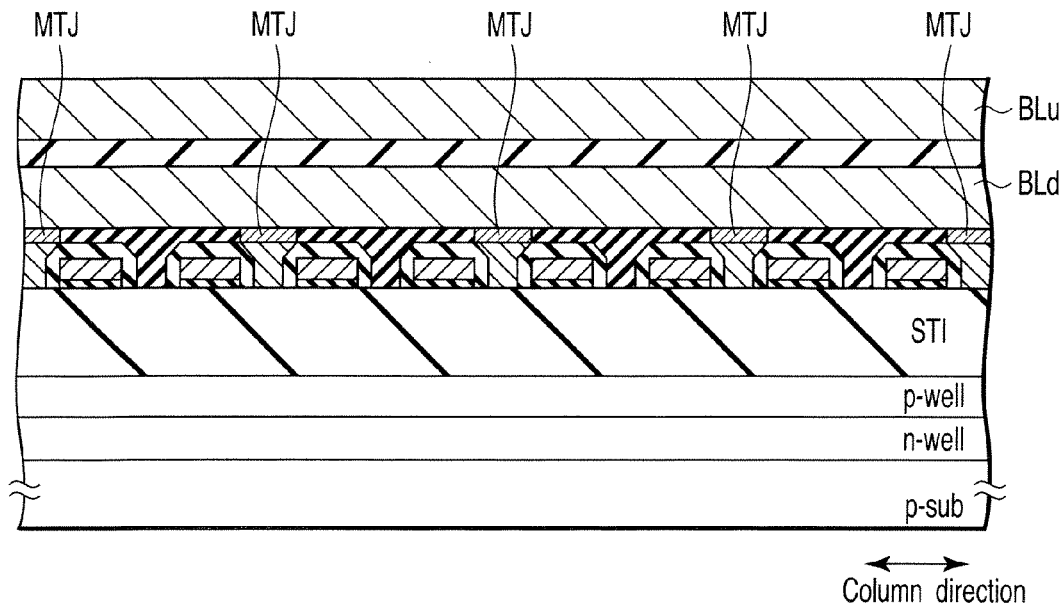
FIG. 25 is a cross-sectional view taken along the line XXV-XXV of FIG. 22.
Figure 26:
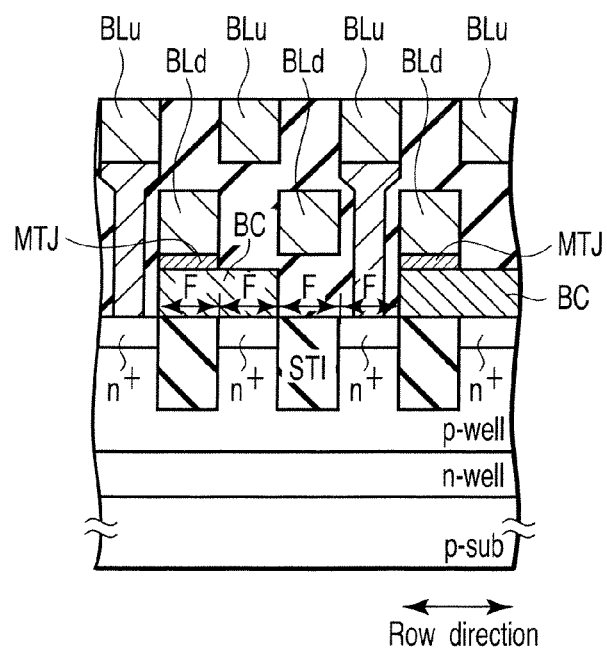
FIG. 26 is a cross-sectional view taken along the line XXVI-XXVI of FIG. 22.
Figure 27:
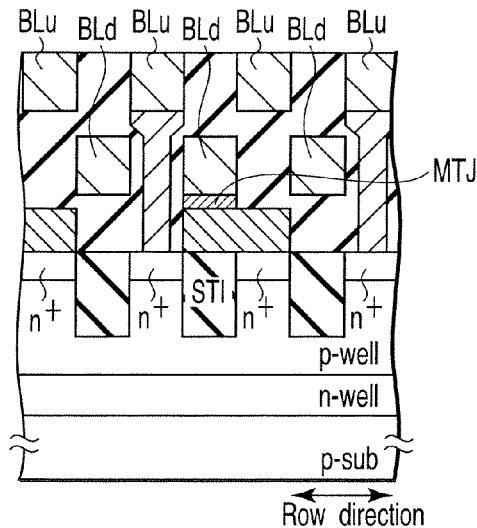
FIG. 27 is a cross-sectional view taken along the line XXVII-XXVII of FIG. 22.
Figure 28:
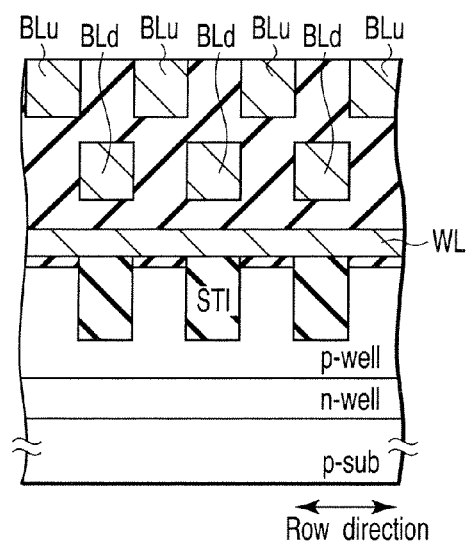
FIG. 28 is a cross-sectional view taken along the line XXVIII-XXVIII of FIG. 22.
Figure 29:
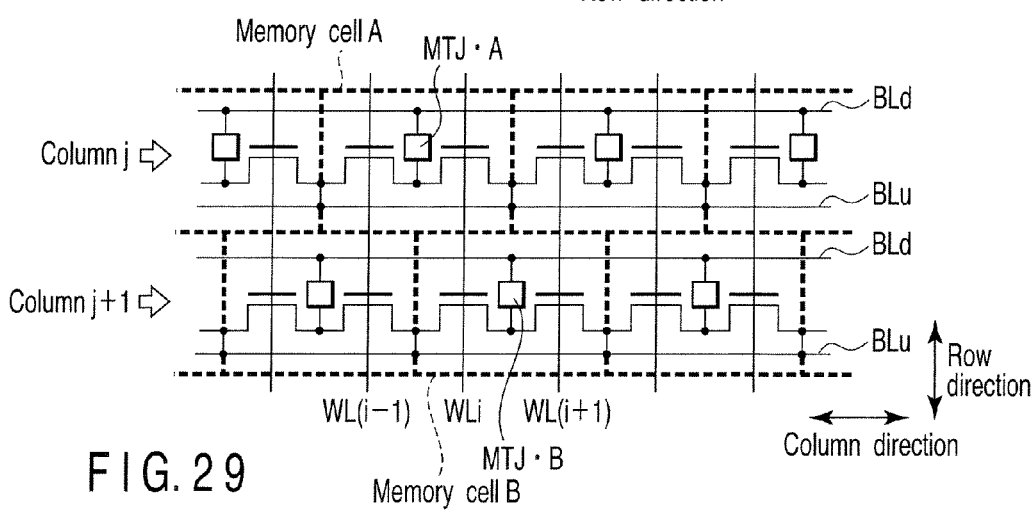
FIG. 29 is a circuit diagram showing an equivalent circuit of a layout of the second embodiment.

Further, FIG. 24 is a cross-sectional view taken along the line XXIV-XXIV of FIG. 22, FIG. 25 is a cross-sectional view taken along the line XXV-XXV of FIG. 22, FIG. 26 is a cross-sectional view taken along the line XXVI-XXVI of FIG. 22, FIG. 27 is a cross-sectional view taken along the line XXVII-XXVII of FIG. 22, FIG. 28 is a cross-sectional view taken along the line XXVIII-XXVIII of FIG. 22, and FIG. 29 is an equivalent circuit of a device of FIGS. 22 to 28.

In FIGS. 22 and 23, size of a cell is F×F. Further, a principal part of the magnetic random access memory becomes the one as shown in FIG. 14.

The second embodiment differs from the first embodiment in that the MTJ element is arranged between the selection transistor and the bit line BLd, and concerning the other points, the second embodiment is the same as the first embodiment.

Therefore, concerning the cell size (1-bit area), column direction becomes 4F, while row direction becomes 2F, thus it is possible to realize $8F^2$.

As shown in FIG. 24, a size of one transistor in the column direction corresponds to 3F, a size of two transistors in the column direction correspond to 6F. However, like the comparative example, as the 1-bit area, 4F is realized by sharing the bit line contact (the contact plug).

As shown in FIGS. 26 and 27, a size of one transistor in the row direction corresponds to F, while a size of the element isolation region (STI) corresponds to F, the 1-bit area results in 2F. That is, F for securing a space between the bit line contacts BC adjacent to the row direction is not necessary.

As in the first embodiment, this is achieved because the bit line contacts BC to the bit line BLd are arranged in the hound's tooth layout. According to this, in two columns j, j+1 adjacent to each other, the bit line contacts BC are not opposite to each other. Further, even though size of the row direction of one bit area is made 2F, it is possible to secure sufficiently a space between the bit line contacts BC.

Thus, also according to the second embodiment, the double gate structure is adopted for improvement of the current drivability (write margin) of the selection transistor, and further, it is possible to make the size per memory cell $8F^2$.

Therefore, it is possible to make a cost per bit of the spin transfer torque magnetic random access memory equal to that of the DRAM, and it becomes possible to realize a new nonvolatile memory with large capacity.

(3) Third Embodiment

A third embodiment relates to address mapping to a memory cell layout of the first and second embodiments.

As already described, in the layout according to the example of the present invention, since the MTJ element is arranged in the hound's tooth layout, two word lines existing on both sides of the memory cell are always different between the even column and the odd column. That is, it is necessary to think out decoding method of address signal to access rightly the memory cell.

Figure 30:
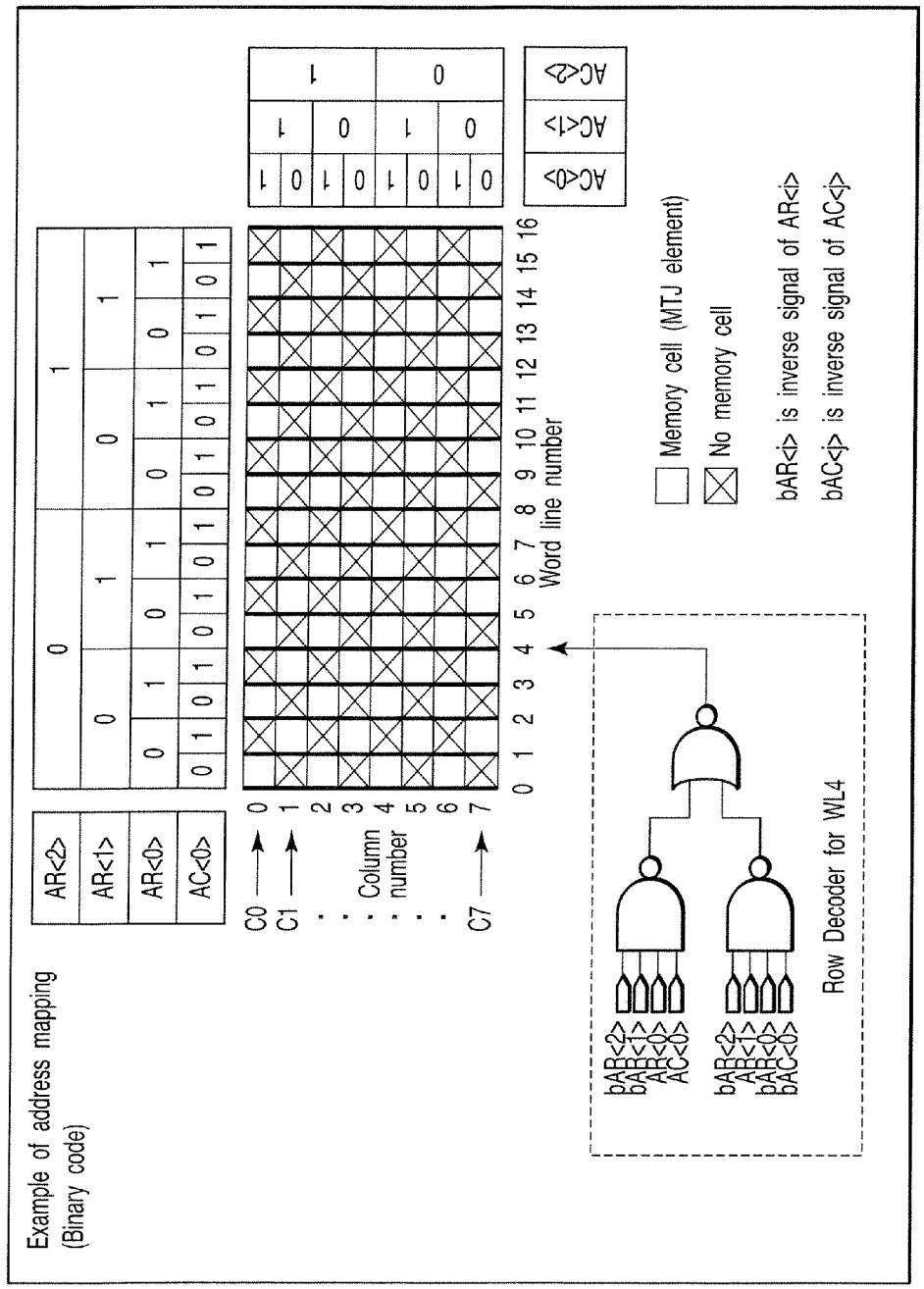
FIG. 30 is a view showing a mapping system due to binary code.
Figure 31:
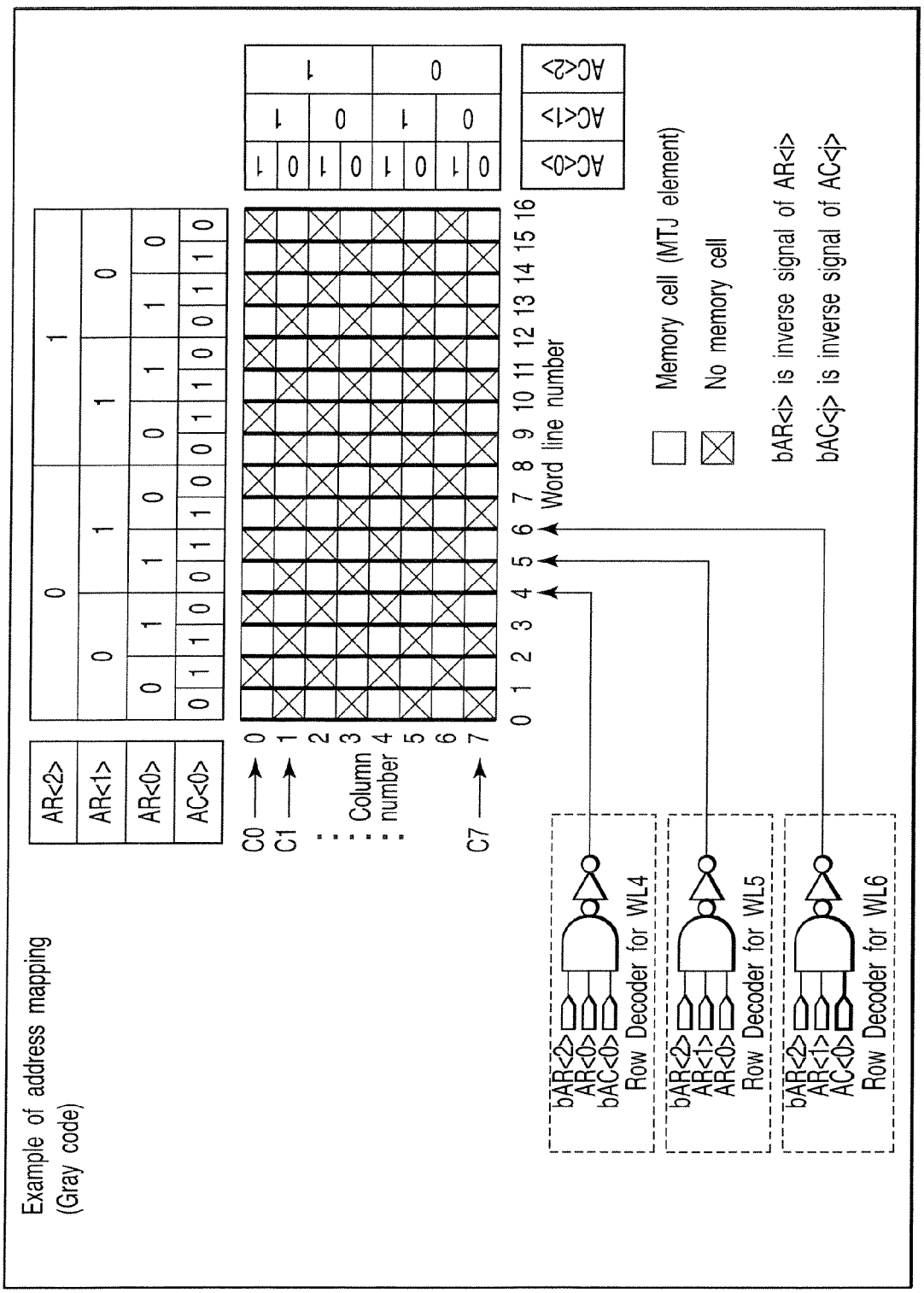
FIG. 31 is a view showing a mapping system due to gray code.

FIGS. 30 and 31 show examples of the address mapping respectively.

It is assumed that the memory cell array is 8×8 bits to simplify the description. The cells of the memory cell array, when being in correspondence to the first embodiment, represent all crossing points of the word line WL and the bit line BLu, while when being in correspondence to the second embodiment, represent all crossing points of the word line WL and the bit line BLd.

Among cells of a memory cell array, in a portion where mark × is attached, the MTJ element is not arranged, while in a portion of white background cell other than the above, the MTJ element is arranged. The white background cell is 64(=8×8) being bit number of the memory cell array.

The MTJ elements are arranged at half of the whole number of the cells (all crossing points), and the MTJ elements have the layout of the hound's tooth layout (or checker board).

A column of a memory cell array is selected with column selection signals C0, C1, . . . C7 obtained by decoding column address signals.

Here, concerning the even columns 0, 2, 4, and 6, it is necessary to activate simultaneously two word lines i, i+1 existing on both sides of the selected MTJ element (memory cell). Note that i is one of 0, 2, 4, 6, 8, 10, 12, and 14.

Further, concerning the odd columns 1, 3, 5, and 7, it is necessary to activate simultaneously two word lines i, i+1 existing on both sides of the selected MTJ element (memory cell). Note that i is one of 1, 3, 5, 7, 9, 11, 13, and 15.

For this reason, in the example of FIG. 30, a mapping system by binary code is adopted.

In this case, a row of a memory cell array is selected while using a total of 4 bits of the least significant bit AC<0> of column address signals showing whether a selected column is even or odd, and row address signals (3 bits) AR<0>, AR<1>, and AR<2> necessary for selecting 8 rows.

For this reason, two NAND circuits with 4 input terminal and one NOR circuit is provided to activate accurately the word line.

Therefore, when adopting the mapping system using the binary code, there is a problem that chip size increases due to complicatedness of the row decoder. Further, there is also a problem on the layout that complicatedness of the row decoder makes it difficult to arrange one row decoder corresponding to one row in the course of miniaturization of the memory cell.

On the contrary, in an example of FIG. 31, the mapping system using the Gray code is adopted.

According to the Gray code, a row of a memory cell array is capable of being selected accurately with 3 bits among a total of 4 bits of the least significant bit AC<0> of the column address signal showing whether the selected column is even or odd, and the row address signals (3 bits) AR<0>, AR<1> and AR<2> necessary for selecting 8 rows.

For instance, when activating a word line (number 4), it is preferable to use 3 bits of AR<0>, bAR<2>, and bAC<0>, and the value of AR<1> can be negligible. Further, when activating a word line (number 5), it is preferable to use 3 bits of AR<0>, AR<1>, and bAR<2>, and the value of AC<0> can be negligible. Furthermore, when activating a word line (number 6), it is preferable to use 3 bits of AR<1>, bAR<2>, and AC<0>, and the value of AR<0> can be negligible.

For this reason, in order to activate accurately the word line, it suffices that one AND circuit with 3 input terminals exists to 1 row.

In general, each word line is capable of being selected by an AND circuit having input terminals of n−1 bits to $2^n$ word lines.

Therefore, when adopting a mapping system according to the Gray code, a row decoder is simplified, and it is possible to contribute to reduction of chip size. Further, since the row decoder is simplified, that one row decoder is arranged corresponding to one row becomes easy, and thus, layout is easily performed.

As described above, in the third embodiment, upon adopting the address mapping using the Gray code, even in the case where the layouts shown in the first and second embodiments are adopted, it is possible to activate the word line without fail.

Figure 32:
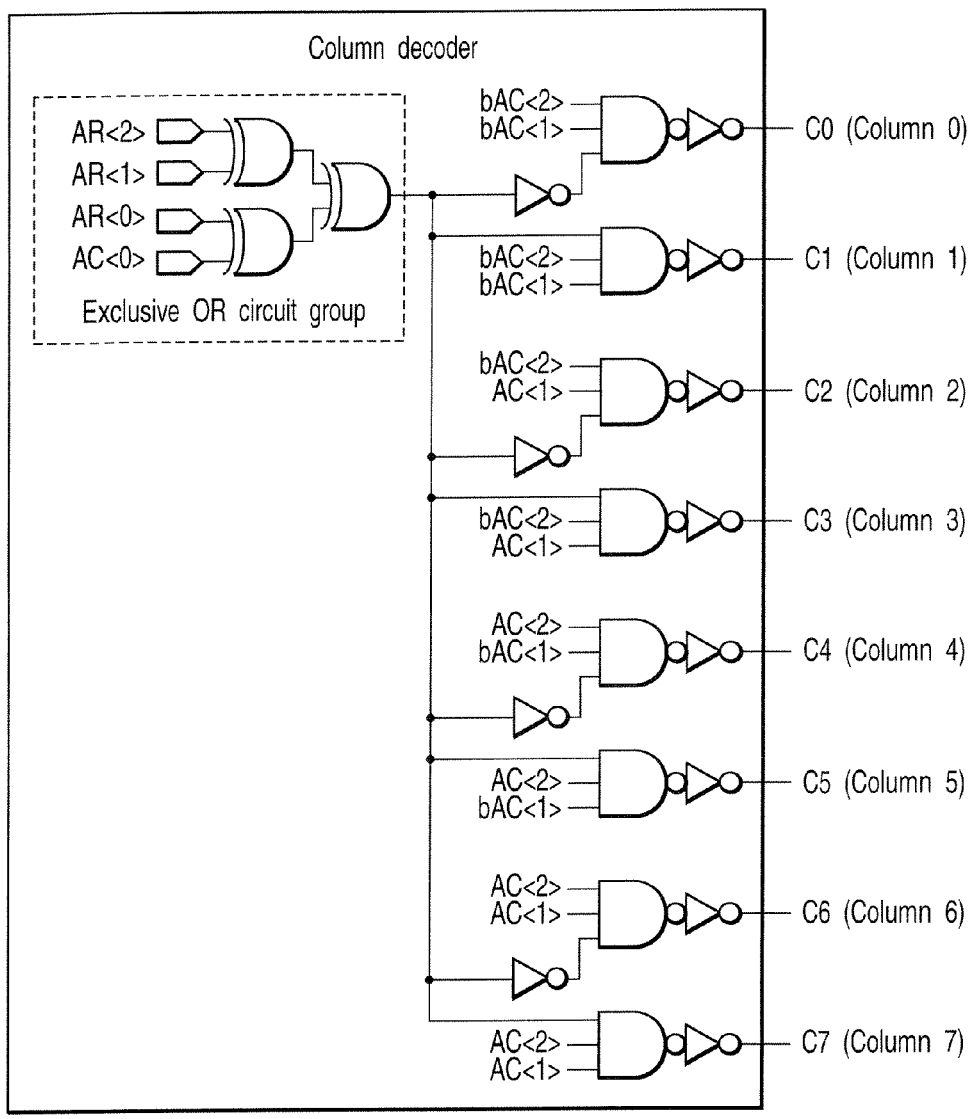
FIG. 32 is a circuit diagram showing a column decoder.

FIG. 32 shows an example of a column decoder.

From adopting the Gray code, it is necessary for the column decoder to be added correction. That is, in addition to the column decoder by an ordinary AND circuit, it becomes necessary to add decoding by exclusive OR circuit group.

Specifically, first, there is taken exclusive OR of the least significant bit AR<0> of the row address signal and the least significant bit AC<0> of the column address signal, and there is taken exclusive OR of high order 2 bits AR<1>, AR<2> of the row address signal. Further, there is taken exclusive OR concerning output signals of the both exclusive ORs.

Then, to the AND circuit (decoder) for selecting the bit lines of even columns 0, 2, 4, and 6, there is input an inverse signal of an output signal of the exclusive OR circuit group, and there is input high order 2 bits AC<1>, AC<2> of the column address signal.

Further, to the AND circuit (decoder) for selecting the bit lines of odd columns 1, 3, 5, and 7, there is input an output signal of the exclusive OR circuit group, and there is input high order 2 bits AC<1>, AC<2> of the column address signal.

Incidentally, the only one exclusive OR circuit group is provided in common to the whole columns, in the present example, to 8 columns.

Generally, when the total number of the column is $2^m$, each column is capable of being selected by the AND circuit having m input terminals.

To one of the m input terminals, an output signal of the exclusive OR circuit group is input, while to remaining input terminals, m−1 bits column address signals other than the least significant bit are input. To the exclusive OR circuit group, the least significant bits of n bits row address signals and m bits column address signals are input.

(5) Others

The above-described embodiments relate to the magnetic random access memory. However, the example of the present invention is effective to a semiconductor memory with double gate structure and which requires realization of high integration and great capacity.

4. CONCLUSION

According to the example of the present invention, it is possible to realize reduction of the cell size of the memory cell composed of 2 MOSFETs and 1 resistance change element.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory comprising:
   a first memory cell including a first resistance change element having a first end and a second end, a first FET and a second FET, which is arranged in an even column;
   a second memory cell including a second resistance change element having a first end and a second end, a third FET and a fourth FET, which is arranged in an odd column;
   a first bit line extending a column direction, which is connected to the first end of the first resistance change element;
   a second bit line extending the column direction, wherein the first and second FETs connected in parallel between the second end of the first resistance change element and the second bit line;
   a third bit line extending the colunm direction, which is connected to the first end of the second resistance change element;
   a fourth bit line extending the column direction, wherein the third and fourth FETs connected in parallel between the second end of the second resistance change element and the fourth bit line;
   a first word line extending a row direction, which is connected to a gate of the first FET;
   a second word line extending the row direction, which is connected to gates of the second and third FETs; and
   a third word line extending the row direction, which is connected to a gate of the fourth FET,
   wherein an address mapping to the first to third word lines is based on one of a binary code or a gray code.

2. The semiconductor memory according to claim 1, further comprising:
   a first contact plug connected between the first bit line and the first resistance change element; and
   a second contact plug connected between the third bit line and the second resistance change element,
   wherein the first and second contact plugs are sifted in the column direction with each other.

3. The semiconductor memory according to claim 1, further comprising:
   a first contact plug connected between the second bit line and the first FET;
   a second contact plug connected between the second bit line and the second FET;
   a third contact plug connected between the fourth bit line and the third FET; and
   a fourth contact plug connected between the fourth bit line and the fourth FET,
   wherein the first and second contact plugs are sifted in the column direction to the third and fourth contact plugs.

4. The semiconductor memory according to claim 1,
   wherein the first resistance change element is sifted in the column direction to the second resistance change element.

5. The semiconductor memory according to claim 1, further comprising:
   memory cells in the even columns including the first memory cell; and
   memory cells in the odd columns including the second memory cell,
   wherein the memory cells in the even columns and the memory cells in the odd columns are shifted in column direction with each other by a half of a pitch of the memory cells in the column direction.

6. The semiconductor memory according to claim 1, further comprising:
   bit lines including the first and third bit lines;

word lines including the first to third word lines; and resistance change elements including the first and second resistance change elements, wherein the resistance change elements are arranged at half of all number of crossing points of the bit lines and the word lines.

7. The semiconductor memory according to claim 1, wherein a wiring layer in which the first and third bit lines are arranged is different from a wiring layer in which the second and fourth bit lines are arranged.

8. The semiconductor memory according to claim 1, wherein when the first memory cell is selected, the first and second word lines are activated.

9. The semiconductor memory according to claim 1, wherein when the second memory cell is selected, the second and third word lines are activated.

10. The semiconductor memory according to claim 1, wherein the second word line is activated in each case when the first memory cell is selected or when the second memory cell is selected.

11. The semiconductor memory according to claim 1, further comprising:

memory cells in the even columns including the first memory cell, wherein two memory cells adjacent to each other share a contact plug which is connected to the first or the second bit line.

12. The semiconductor memory according to claim 1, further comprising:

memory cells in the odd columns including the second memory cell, wherein two memory cells adjacent to each other share a contact plug which is connected to the third or the fourth bit line.

13. The semiconductor memory according to claim 1, wherein state of the first resistance change element is determined by flow direction of a current caused to flow between the first and second bit lines.

14. The semiconductor memory according to claim 1, wherein state of the second resistance change element is determined by flow direction of a current caused to flow between the third and fourth bit lines.

15. The semiconductor memory according to claim 1, wherein each of the first and second resistance change elements is a magnetoresistive element.

16. The semiconductor memory according to claim 1, wherein each word line to 2n word lines including the first to third word lines is selected by an AND circuit having an input terminal of n-1 bits.

17. The semiconductor memory according to claim 16, wherein when the total number of columns composed of the even and odd columns is 2m, each column is selected by an AND circuit having m bits input terminal, and an output signal of an exclusive OR circuit group is input to one of the m bits input terminal.

18. The semiconductor memory according to claim 17, wherein n bits row address signal and a least significant bit of m bits column address signal, which are shared by all columns, are input to the exclusive OR circuit group.

* * * * *